(12) United States Patent
Carlson

(10) Patent No.: US 10,910,476 B2
(45) Date of Patent: Feb. 2, 2021

(54) INTEGRATED STRUCTURES HAVING GALLIUM-CONTAINING REGIONS

(71) Applicant: Micron Technology, Inc., Boise, ID (US)

(72) Inventor: Chris M. Carlson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 118 days.

(21) Appl. No.: 16/589,985

(22) Filed: Oct. 1, 2019

(65) Prior Publication Data

US 2020/0035795 A1 Jan. 30, 2020

Related U.S. Application Data

(63) Continuation of application No. 15/149,553, filed on May 9, 2016, now Pat. No. 10,460,943.

(51) Int. Cl.
*H01L 21/28* (2006.01)

(52) U.S. Cl.
CPC .. *H01L 29/40117* (2019.08); *H01L 29/40114* (2019.08)

(58) Field of Classification Search
CPC .................. H01L 29/40114; H01L 29/40117
USPC .................................................. 257/314–320
See application file for complete search history.

(56) References Cited

U.S. PATENT DOCUMENTS

| 2008/0246078 | A1* | 10/2008 | Huo | B82Y 10/00 |
| | | | | 257/324 |
| 2009/0096009 | A1* | 4/2009 | Dong | H01L 29/7883 |
| | | | | 257/321 |
| 2013/0175504 | A1 | 7/2013 | Levy et al. | |
| 2014/0291669 | A1 | 10/2014 | Ji et al. | |

OTHER PUBLICATIONS

Gilmer et al., "Band Engineered Tunnel Oxides for Improved TANOS-Type Flash Program/Erase with Good Retention and 100K Cycle Endurance", IEEE, 2009, United States, pp. 156-157.

* cited by examiner

*Primary Examiner* — Marvin Payen
(74) *Attorney, Agent, or Firm* — Wells St. John P.S.

(57) ABSTRACT

Some embodiments include an integrated structure having a gallium-containing material between a charge-storage region and a semiconductor-containing channel region. Some embodiments include an integrated structure having a charge-storage region under a conductive gate, a tunneling region under the charge-storage region, and a semiconductor-containing channel region under the tunneling region. The tunneling region includes at least one dielectric material directly adjacent a gallium-containing material. Some embodiments include an integrated structure having a charge-trapping region under a conductive gate, a first oxide under the charge-storage region, a gallium-containing material under the first oxide, a second oxide under the gallium-containing material, and a semiconductor-containing channel region under the second oxide.

21 Claims, 3 Drawing Sheets

INTEGRATED STRUCTURES HAVING GALLIUM-CONTAINING REGIONS

RELATED PATENT DATA

This patent resulted from a continuation of U.S. patent application Ser. No. 15/149,553 which was filed May 9, 2016 which is hereby incorporated by reference herein.

TECHNICAL FIELD

Integrated structures having gallium-containing regions.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND memory cell may include a charge-storage material between a conductive gate and a channel region. The charge-storage material may correspond to a floating gate (e.g., may comprise polycrystalline silicon or other suitable semiconductor), or to a charge-trapping material (e.g., silicon nitride, silicon oxynitride, conductive nanodots, etc.).

In some applications a NAND structure may comprise charge-trapping material (for instance, silicon nitride) spaced from a channel region by a barrier dielectric material. In operation, the NAND structure has two distinguishable memory states based upon whether or not a sufficient number of electrons are trapped by the charge-trapping material. Programming of the NAND structure may comprise migration of electrons through the barrier dielectric material and onto the charge-trapping material. Erasure of the NAND structure may comprise detrapping of electrons and migration of the detrapped electrons back through the barrier dielectric material.

A problem that occurs is that it can be difficult to remove the trapped electrons, and accordingly unreasonably high voltages may be required for erasure of NAND structures. An approach toward solving such problem is to provide a thin layer of silicon nitride within the barrier dielectric. The thin layer of nitride may enable hole injection to assist in the detrapping (erase) operation. However, the thin layer of nitride within the barrier dielectric may undesirably provide parasitic trapping which pulls trapped electrons from the primary charge-trapping material of the NAND structure. The parasitic trapping may lead to decay of a memory state, and accordingly to undesired volatility of data stored within the NAND structure.

It is desired to develop improved NAND structures which overcome the problems and difficulties described above.

DETAILED DESCRIPTION OF THE ILLUSTRATED EMBODIMENTS

Some embodiments include utilization of gallium-containing material within barrier dielectric of NAND structures. The gallium-containing material may advantageously enable hole injection similar to silicon nitride utilized in conventional NAND structures, while avoiding, or even eliminating, problematic parasitic trapping. The NAND structures may utilize any suitable charge-storage material, including, for example, floating gate material or charge-trapping material. In some embodiments the NAND structures may utilize charge-trapping material, and may correspond to structures analogous to MONOS (metal-oxide-nitride-oxide-semiconductor), MANOS (metal-aluminum oxide-nitride-oxide-semiconductor), SONOS (semiconductor-oxide-nitride-semiconductor), etc. Example embodiments are described below with reference to FIGS. 1-5.

Figure 1:
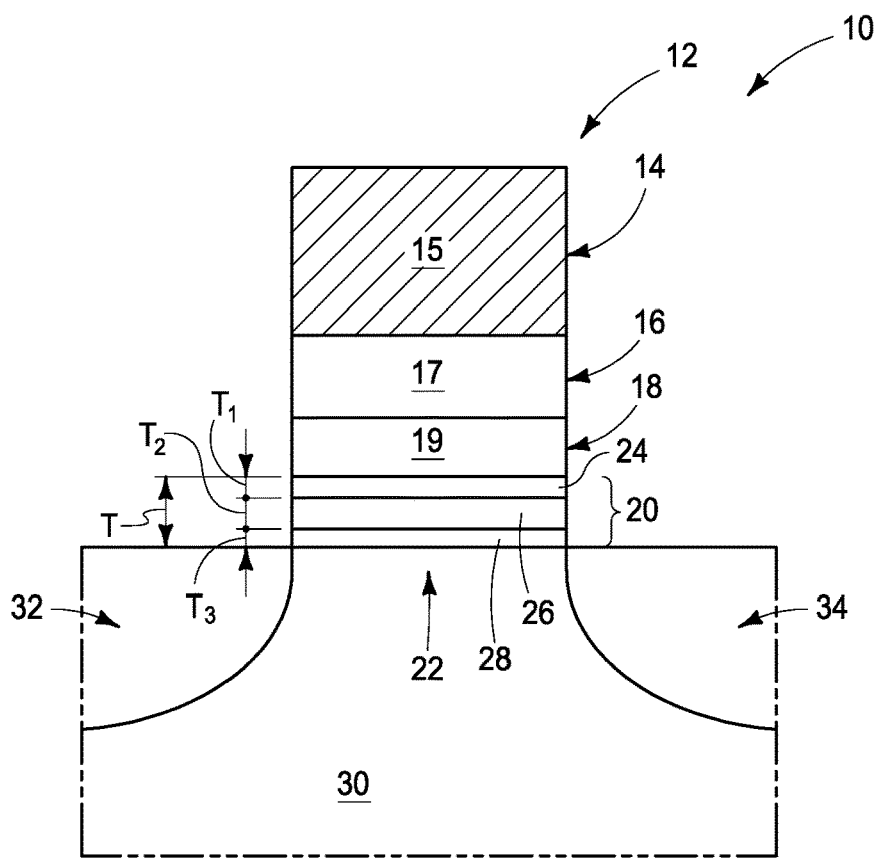
FIG. 1 is a diagrammatic cross-sectional view of an example embodiment integrated structure comprising a gallium-containing region.

Referring to FIG. 1, a portion of a construction 10 comprises an integrated NAND memory cell structure 12. The memory cell structure includes a conductive gate 14, an insulative region 16 under the conductive gate, a charge-storage region 18 under the insulative material, a tunneling region 20 under the charge-storage region, and a channel region 22 under the tunneling region.

The conductive gate 14 comprises gate material 15. Such gate material may comprise any suitable composition or combination of compositions; and in some embodiments may comprise, consist essentially of, or consist of one or more metals (for instance, tungsten, tantalum, etc.), metal-containing compositions (for instance, metal nitrides, metal silicides, alloys of two or more metals, etc.) and/or conductively-doped semiconductor materials (for instance, conductively-doped silicon, conductively-doped germanium, etc.). Although the conductive gate is shown to be homogeneous, in some embodiments the gate may comprise two or more conductive compositions adjacent to one another.

Insulative region 16 comprises insulative material 17. Such insulative material may comprise any suitable insulative composition or combination of compositions; and in some embodiments may comprise, for example, one or more of aluminum oxide, silicon oxide, etc. Although the insulative region 16 is shown to be homogeneous, in some embodiments the insulative region may comprise two or more dielectric compositions adjacent to one another.

The charge-storage region 18 comprises charge-storage material 19. In some embodiments the charge-storage material may correspond to floating gate material (e.g., silicon and/or other suitable semiconductor), or charge-trapping material (e.g., silicon nitride, silicon oxynitride, conductive nanodots, etc.).

The tunneling region 20 comprises three separate materials 24, 26 and 28. The central material 26 comprises gallium, and the outer materials 24 and 28 are dielectric materials. In some embodiments the central gallium-containing material 26 may be considered to be vertically sandwiched between the dielectric materials 24 and 28.

The gallium-containing material 26 may include gallium and oxygen in some embodiments. In such embodiments, the gallium concentration may be within a range of from about 10 atomic percent to about 50 atomic percent. In some example embodiments the gallium-containing material may correspond to gallium oxide having the stoichiometry $Ga_2O_3$. The gallium-containing material 26 may comprise, consist essentially of, or consist of gallium and oxygen. In some embodiments, the gallium-containing material may include one or more substances selected from the group consisting of silicon, aluminum, hafnium and zirconium. Such substances may be, for example, dopants provided within a matrix comprising gallium and oxygen. A total concentration of said one or more substances may be within a range of from about 0.1 atomic percent to about 10 atomic percent within such matrix. In particular embodiments, the gallium-containing material may include gallium and oxygen (with the gallium being present to a concentration within a range of from about 10 atomic percent to about 50 atomic percent); and may further comprise one or more substances selected from the group consisting of silicon, aluminum, hafnium and zirconium, with a total concentration of such substances being within a range of from about 0.1 atomic percent to about 10 atomic percent.

The dielectric materials 24 and 28 may be referred to as a first and second dielectric material, respectively. The dielectric materials 24 and 28 may be the same composition as one another, or may be different compositions relative to one another. In some example embodiments the dielectric materials 24 and 28 may both be oxides. For instance, in some embodiments each of the dielectric materials 24 and 28 may comprise, consist essentially of, or consist of silicon dioxide. If the dielectric materials 24 and 28 are both oxide, they may be referred to as a first oxide and a second oxide, respectively.

The tunneling region has a vertical thickness T. In some example embodiments, such thickness may be less than or equal to about 100 angstroms (Å), and may, for example, be within a range of from about 20 Å to about 80 Å.

The materials 24, 26 and 28 have vertical thicknesses T1, T2 and T3, respectively. In some embodiments the vertical thickness T2 of the gallium-containing material 26 may be within a range of from 10 Å to about 100 Å, within a range of from about 30 Å to about 70 Å, etc. The vertical thicknesses T1 and T3 of dielectric materials 24 and 28 may be the same as one another in some embodiments, or may differ from one another in other embodiments. In some embodiments one or both of the dielectric materials 24 and 28 may be omitted, as discussed in more detail below with reference to FIGS. 3-5.

The tunneling region 24 may be alternatively referred to as a barrier region. In some embodiments the region 24 is engineered to have suitable bandgap properties to ease removal of electrons from charge-storage material 19 (as discussed below with reference to FIG. 2). Accordingly, region 24 may be referred to as a bandgap-engineered region or a barrier-engineered region.

The semiconductor-containing channel region 22 is part of a semiconductor substrate 30. Such substrate may comprise any suitable semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, semiconductor substrates.

Conductively-doped source/drain regions 32 and 34 extend into the substrate 30, and are on opposing lateral sides of channel region 22. The source/drain regions may be doped with any suitable dopant, and may be of any appropriate conductivity type. For instance, in some example embodiments the source/drain regions may be majority n-type doped.

The NAND structure 12 may be analogous to a SONOS structure, MONOS structure or MANOS structure in some example embodiments. For instance, if gate material 15 comprises silicon, insulative material 17 comprises silicon dioxide, charge-storage material 19 comprises silicon nitride, and semiconductor material 30 comprises silicon, the NAND structure will be analogous to a SONOS structure. As another example, if gate material 15 comprises metal, insulative material 17 comprises silicon dioxide, charge-storage material 19 comprises silicon nitride, and substrate 30 comprises silicon, the NAND structure will be analogous to a MONOS structure. As another example, if gate material 15 comprises metal, insulative material 17 comprises aluminum oxide, charge-storage material 19 comprises silicon nitride, and substrate 30 comprises silicon, the NAND structure will be analogous to a MANOS structure. The metal-containing gate material of the MONOS-type structure or MANOS-type structure may be any suitable material, including, for example, tantalum, tungsten, etc.

An advantage of the NAND structure 12 of FIG. 1 is that the gallium-containing material 26 may reduce energy (i.e. voltage) required for detrapping of electrons from the charge-storage material 19, while having appropriate dielectric properties to maintain electrical separation between charge-storage region 19 and channel region 22. There have been conventional NAND structures with tunneling regions analogous to the region 20, but using silicon nitride instead of the gallium-containing material 26. The silicon nitride has appropriate bandgap properties to ease detrapping of electrons from charge-storage material 19, and has desired dielectric properties to electrically separate the charge-storage material 19 from the channel region 22. However, the silicon nitride within the tunneling region is itself somewhat "trappy", which may lead to the memory-state-degradation problems described above in the "background" section of this disclosure. The gallium-containing material 26 may have bandgap properties and dielectric properties similar to those of silicon nitride, and may thus provide advantages similar to those of silicon nitride while avoiding the "trappy" characteristics of silicon nitride.

Figure 2:
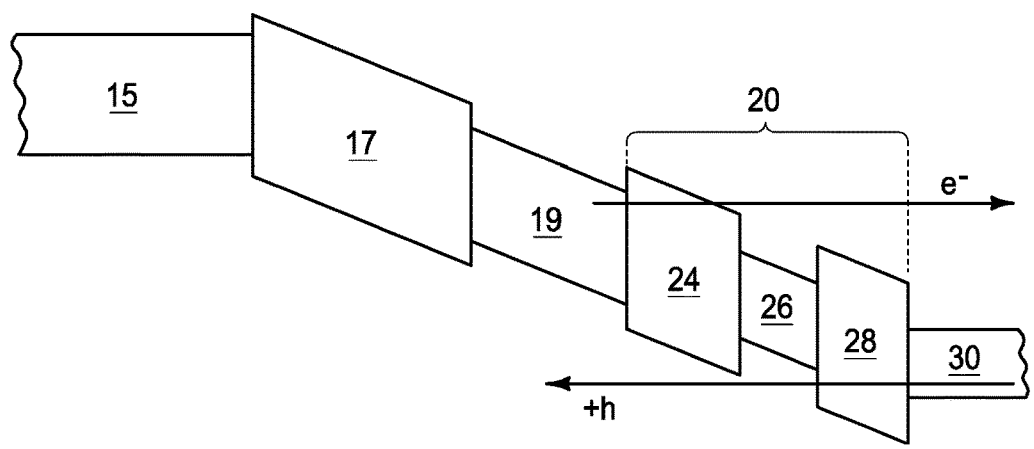
FIG. 2 is a band-gap diagram illustrating example operational characteristics for the integrated structure of FIG. 1.

FIG. 2 is a bandgap diagram of an example embodiment NAND structure 12 of the type illustrated in FIG. 1. The diagram of FIG. 2 illustrates that the bandgap of the gallium-containing material 26 may fall within a regime that enables holes (+h) to tunnel across the tunneling region 20 without being impeded by the gallium-containing material 26. The holes may ease removal of electrons (e−) from the charge-storage material 19. Further, the gallium-containing material 26 may comprise suitable dielectric characteristics to have an effective oxide thickness which provides the desired dielectric separation between channel region 22 and charge-storage material 19. For instance, $Ga_2O_3$ has a bandgap of about 4.5 electronvolts and a dielectric constant within a range of from about 8 to about 10, which are roughly similar to the bandgap and dielectric constant of silicon nitride.

The dielectric properties of material 26 and/or the bandgap properties of the material may be tailored for particular applications through modification of the thickness and/or composition of material 26. In some embodiments one or more of the dopants described above (i.e., silicon, aluminum, hafnium and zirconium) may be provided within the gallium-containing material and utilized to adjust the bandgap properties and/or dielectric properties of the gallium-containing material. Further, if the gallium-containing material comprises both gallium and oxygen, the relative concentration of gallium to oxygen may be utilized to adjust bandgap properties and/or dielectric properties of the gallium-containing material.

Figure 3:
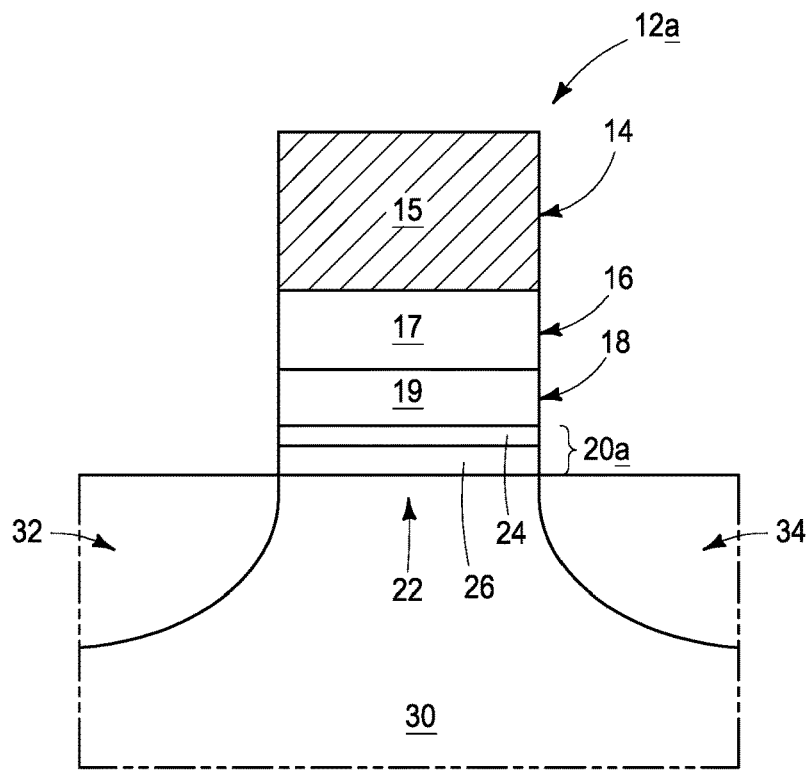
FIGS. 3-5 are diagrammatic cross-sectional views of additional example embodiment integrated structures comprising gallium-containing regions.
Figure 4:
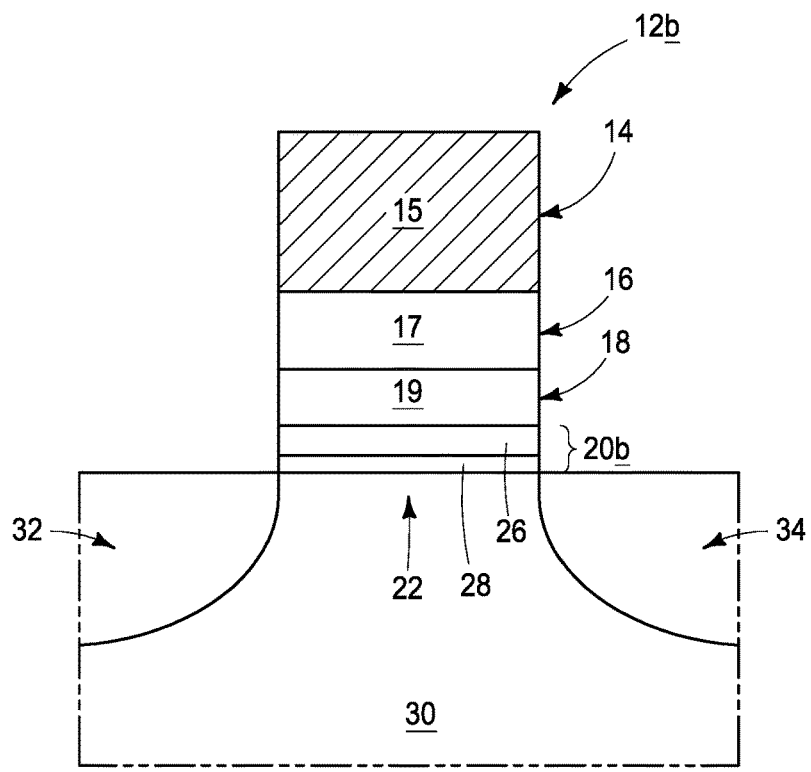

The NAND structure 12 of FIG. 1 is an example configuration in which a tunneling region 20 has a gallium-containing material 26 vertically sandwiched between a pair of dielectric materials 24/28. In other embodiments, one or both of the dielectric regions 24 and 28 may be omitted. For instance, FIGS. 3 and 4 illustrate configurations 12a and 12b in which one of the dielectric materials 24/28 is omitted. Specifically, FIG. 3 illustrates a tunneling region 20a comprising only the dielectric material 24 adjacent gallium-containing material 26, and FIG. 4 illustrates a tunneling region 20b comprising only the dielectric material 28 adjacent the gallium-containing material 26.

Figure 5:
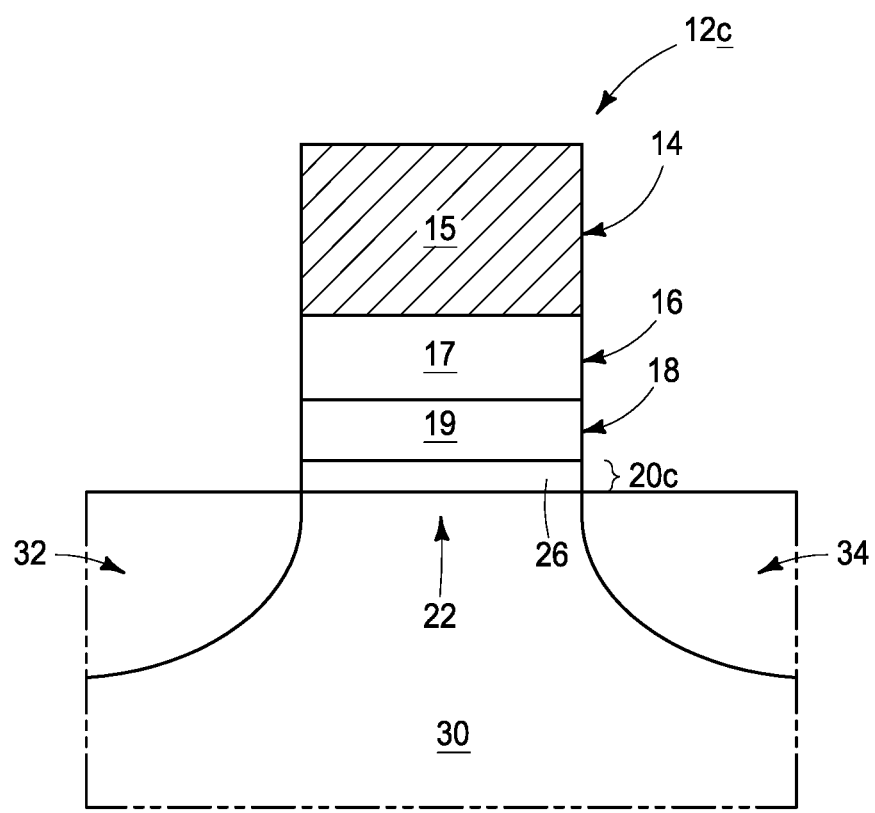

As another example, FIG. 5 illustrates a NAND structure 12c having a tunneling region 20c that comprises only gallium-containing material 26 (i.e., which lacks both of the dielectric materials 24 and 28 of the FIG. 1 configuration).

The structures described herein may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

Both of the terms "dielectric" and "electrically insulative" may be utilized to describe materials having insulative electrical properties. The terms are considered synonymous in this disclosure. The utilization of the term "dielectric" in some instances, and the term "electrically insulative" in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

Some embodiments include an integrated structure comprising a gallium-containing material between a charge-storage region and a semiconductor-containing channel region.

Some embodiments include an integrated structure having a charge-storage region under a conductive gate, a tunneling region under the charge-storage region, and a semiconductor-containing channel region under the tunneling region. The tunneling region includes at least one dielectric material directly adjacent a gallium-containing material.

Some embodiments include an integrated structure having a charge-trapping region under a conductive gate, a first oxide under the charge-trapping region, a gallium-containing material under the first oxide, a second oxide under the gallium-containing material, and a semiconductor-containing channel region under the second oxide.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming an integrated structure, comprising:
    forming a conductive gate;
    forming a charge-storage region under the conductive gate;
    forming a tunneling region under the charge-storage region;
    forming a semiconductor-containing channel region under and directly against the tunneling region, the semiconductor-containing channel region comprising monocrystalline silicon and being part of a monocrystalline-silicon substrate that extends laterally outward beyond the charge-storage region along a cross-section; and
    wherein the tunneling region includes a dielectric material consisting essentially of $SiO_2$ directly adjacent a gallium-containing material and directly adjacent the semiconductor-containing channel region, the gallium-containing region covering an entire width of an upper surface of the dielectric material.

2. The method of claim 1 wherein the gallium-containing material has a vertical thickness within a range of from about 10 Å to about 100 Å.

3. The method of claim 1 wherein the tunneling region has a vertical thickness of less than or equal to about 100 Å.

4. The method of claim 1 wherein the dielectric material is a first dielectric material and the tunneling region includes the gallium-containing material vertically sandwiched between the first dielectric material and a second dielectric material; the first dielectric material being a first oxide material and the second dielectric material being a second oxide material.

5. The method of claim 4 wherein the first and second oxide materials have about a same thickness as one another.

6. The method of claim 4 wherein the first and second oxide materials have different thicknesses relative to one another.

7. The method of claim 4 wherein the first and second oxide materials have a same composition as one another.

8. The method of claim 4 wherein the first and second oxide materials have different compositions relative to one another.

9. The integrated structure of claim 1 wherein the gallium-containing material includes gallium and oxygen.

10. The integrated structure of claim 9 wherein the gallium-containing material includes one or more substances selected from the group consisting of silicon, aluminum, hafnium and zirconium.

11. A method of forming an integrated structure, comprising:
   forming a conductive gate;
   forming a charge-trapping region under the conductive gate;
   forming a first oxide under the charge-trapping region;
   forming a gallium-containing material under the first oxide;
   forming a second oxide consisting essentially of $SiO_2$ under and directly adjacent to the gallium-containing material, the second oxide having an upper surface having a width, the gallium-containing material extending along an entirety of the width; and
   forming a channel region under the second oxide, the channel region comprising monocrystalline silicon that physically contacts the second oxide.

12. The method of claim 11 wherein the first and second oxides are both silicon dioxide.

13. The method of claim 11 wherein the first and second oxides are different compositions relative to one another.

14. The method of claim 11 wherein the gallium-containing material includes gallium and oxygen.

15. The method of claim 14 wherein a concentration of the gallium within the gallium-containing material is within a range of from about 10 atomic percent to about 50 atomic percent.

16. The method of claim 15 wherein the gallium-containing material includes one or more substances selected from the group consisting of silicon, aluminum, hafnium and zirconium.

17. The method of claim 16 wherein the gallium-containing material includes silicon to a concentration within a range of from about 0.1 atomic percent to about 10 atomic percent.

18. The method of claim 16 wherein the gallium-containing material includes aluminum to a concentration within a range of from about 0.1 atomic percent to about 10 atomic percent.

19. The method of claim 16 wherein the gallium-containing material includes zirconium to a concentration within a range of from about 0.1 atomic percent to about 10 atomic percent.

20. The method of claim 16 wherein the gallium-containing material includes hafnium to a concentration within a range of from about 0.1 atomic percent to about 10 atomic percent.

21. A method of forming an integrated structure comprising:
   providing a monocrystalline silicon substrate;
   forming a channel region within the substrate;
   forming a tunneling region over the directly against the channel region, the tunneling region including a dielectric material consisting essentially of $SiO_2$, the dielectric material having an upper surface having a width; and
   forming a gallium-containing material directly against and extending along an entirety of the width of the upper surface of the dielectric material.

* * * * *

UNITED STATES PATENT AND TRADEMARK OFFICE
CERTIFICATE OF CORRECTION

| | | |
|---|---|---|
| PATENT NO. | : 10,910,476 B2 | Page 1 of 1 |
| APPLICATION NO. | : 16/589985 | |
| DATED | : February 2, 2021 | |
| INVENTOR(S) | : Chris M. Carlson | |

It is certified that error appears in the above-identified patent and that said Letters Patent is hereby corrected as shown below:

In the Claims

Column 7, Line 9 - Replace "The integrated structure of claim 1" with --The method of claim 1--

Column 7, Line 11 - Replace "The integrated structure of claim 9" with --The method of claim 9--

Signed and Sealed this
Eleventh Day of May, 2021

Drew Hirshfeld
*Performing the Functions and Duties of the*
*Under Secretary of Commerce for Intellectual Property and*
*Director of the United States Patent and Trademark Office*